(12) United States Patent
Naraki (10) Patent No.: US 11,080,638 B2
(45) Date of Patent: Aug. 3, 2021

(54) ANALYSIS TECHNIQUE PRESENTING SYSTEM, METHOD, AND PROGRAM

(71) Applicant: TOYOTA JIDOSHA KABUSHIKI KAISHA, Toyota (JP)

(72) Inventor: Mika Naraki, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 292 days.

(21) Appl. No.: 15/915,176

(22) Filed: Mar. 8, 2018

(65) Prior Publication Data

US 2018/0314777 A1    Nov. 1, 2018

(30) Foreign Application Priority Data

Apr. 27, 2017 (JP) .............................. JP2017-088661

(51) Int. Cl.
*G06Q 10/06* (2012.01)
*G06Q 10/00* (2012.01)
(Continued)

(52) U.S. Cl.
CPC ......... *G06Q 10/0637* (2013.01); *G06F 30/20* (2020.01); *G06Q 10/00* (2013.01);
(Continued)

(58) Field of Classification Search
None
See application file for complete search history.

(56) References Cited

U.S. PATENT DOCUMENTS 4,791,558 A * 12/1988 Chaitin ..................... G06F 8/52
717/140
8,752,013 B2 * 6/2014 Hadar ..................... G06Q 30/06
717/101
(Continued)

FOREIGN PATENT DOCUMENTS

JP     2008-269015 A    11/2008
JP     2009-080696 A     4/2009
(Continued)

OTHER PUBLICATIONS

J. Chen, R.A. Adomaitis, An object-oriented framework for modular chemical process simulation with semiconductor processing applications, Computers and Chemical Engineering 30 (2006) 1354-1380 (Year: 2006).*

*Primary Examiner* — Lina M Cordero
(74) *Attorney, Agent, or Firm* — Oliff PLC (57) ABSTRACT

The analysis technique presenting system includes: a storage apparatus storing a plurality of analysis modules that are divided from the analysis processing into a plurality of steps, a plurality of analysis techniques that combine some of the analysis modules, analysis module information that associates the analysis module with the corresponding model of the mechanism, and analysis technique information that associates a list of the analysis modules belonging to the corresponding analysis technique with the model; an identifying unit identifies, when the analysis technique associated with an input model input is not present in the analysis technique information, the analysis module matching the input model from the analysis module information; a replacing unit replaces the analysis module, which is associated with the model different from the input model with the identified analysis module; and a presenting unit presents the analysis technique including the analysis module replaced.

7 Claims, 5 Drawing Sheets

(51) Int. Cl.
*G06F 30/20* (2020.01)
*G06F 17/14* (2006.01)
*G01M 13/04* (2019.01)
*G01M 13/00* (2019.01)

(52) U.S. Cl.
CPC ............ *G01M 13/00* (2013.01); *G01M 13/04* (2013.01); *G06F 17/142* (2013.01)

(56) References Cited

U.S. PATENT DOCUMENTS

| | | |
|---|---|---|
| 2008/0256304 A1 | 10/2008 | Kezuka et al. |
| 2009/0083610 A1 | 3/2009 | Arai et al. |
| 2011/0202717 A1 | 8/2011 | Kezuka et al. |
| 2012/0017054 A1 | 1/2012 | Arai et al. |
| 2015/0369698 A1* | 12/2015 | Sakaguchi .......... G01M 13/045 702/56 |
| 2017/0177546 A1* | 6/2017 | Heinz .................... G06F 17/18 |
| 2018/0025276 A1* | 1/2018 | Hill ....................... G06Q 10/06 706/11 |

FOREIGN PATENT DOCUMENTS

| | | |
|---|---|---|
| JP | 2016-212642 A | 12/2016 |
| JP | 2017-212009 A | 11/2017 |

\* cited by examiner

NUMBER OF PACKAGES: 8    NUMBER OF MODULES: 18

| GENRE | PACKAGE NAME (ANALYSIS PURPOSE) | INPUT STEP: INPUT FOR SAMPLING DATA | ANALYSIS STEP: DATA EXTRACTION | ANALYSIS STEP: ABSOLUTE VALUE | ANALYSIS STEP: EXTRACT DATA NEAR MAXIMUM (NUMBER OF DATA ­–1000: 1, 1001–5000: 10, 5001–: 20) | ANALYSIS STEP: AVERAGE BY EACH COLUMN | ANALYSIS STEP: AVERAGE BY EACH ROW | ANALYSIS STEP (WHITE NOISE) | DETERMINATION STEP | OUTPUT STEP |
|---|---|---|---|---|---|---|---|---|---|---|
| BASIC STATISTICS | MAXIMUM VALUE DETERMINATION (INCLUDING NOISE) | ✓ | ✓ | — | EXTRACT DATA NEAR MAXIMUM | AVERAGE BY EACH COLUMN | AVERAGE BY EACH ROW | — | COMPARE AND DETERMINE NORMAL VALUE | WARNING POPUP |
| BASIC STATISTICS | SKEWNESS DETERMINATION | ← | ← | — | — | SKEWNESS OF EACH COLUMN | ← | — | ← | x-R MANAGEMENT MAP |
| BASIC STATISTICS | KURTOSIS DETERMINATION | ← | ← | — | — | KURTOSIS OF EACH COLUMN | ← | — | ← | ← |
| WAVEFORM ANALYSIS | VIBRATION "QUALITY" ANALYSIS (RAW DATA FFT) | ← | ← | — | — | FFT OF EACH COLUMN | ← | — | ← | ← |
| WAVEFORM ANALYSIS | VIBRATION "QUANTITY" ANALYSIS (ENVELOPE +FFT) | ← | ← | ABSOLUTE VALUE | LOW PASS FILTER BY EACH COLUMN | ← | ← | — | COMPARE AND DETERMINE NORMAL VALUE | WARNING POPUP / x-R MANAGEMENT MAP |
| WAVEFORM ANALYSIS | CREST FACTOR DETERMINATION | ← | ← | — | — | — | CREST FACTOR | WHITE NOISE | ABSOLUTE VALUE DETERMINATION | WARNING POPUP / x-R MANAGEMENT MAP |
| WAVEFORM ANALYSIS | BEARING SCRATCH DIAGNOSIS | ← | ← | ABSOLUTE VALUE | LOW PASS FILTER BY EACH COLUMN | FFT OF EACH COLUMN | AVERAGE BY EACH COLUMN | — | BEARING DETERMINATION | WARNING POPUP / x-R MANAGEMENT MAP |
| WAVEFORM ANALYSIS | GEAR MESH DIAGNOSIS | ← | ← | — | — | ← | ← | WHITE NOISE | GEAR DETERMINATION | WARNING POPUP / x-R MANAGEMENT MAP |

MODULE LIST

ANALYSIS TECHNIQUE PRESENTING SYSTEM, METHOD, AND PROGRAM

CROSS REFERENCE TO RELATED APPLICATIONS

This application is based upon and claims the benefit of priority from Japanese patent application No. 2017-088661, filed on Apr. 27, 2017, the disclosure of which is incorporated herein in its entirety by reference.

BACKGROUND

The present disclosure relates to an analysis technique presenting system, a method, and a program.

Japanese Unexamined Patent Application Publication No. 2016-212642 discloses technology related to an evaluation of a prediction model created to predict an occurrence of an abnormality in facilities or the like. The technology according to Japanese Unexamined Patent Application Publication No. 2016-212642 identifies event information to be predicted in advance.

SUMMARY

As described above, the technology according to Japanese Unexamined Patent Application Publication No. 2016-212642 evaluates the created prediction model. However, there are various analysis requests for analyzing sampling data collected from the facilities or the like in order to predict an occurrence of an abnormality in the facilities or the like. For this reason, many prediction models are required. However, creating all of them in advance has some limitations.

The present disclosure has been made to solve such a problem. An object of the present disclosure is to provide an analysis technique presenting system, a method, and a program for presenting an appropriate analysis technique in response to an analysis request.

A first example aspect of the present disclosure is an analysis technique presenting system for presenting an analysis technique according to a mechanism included in a facility. The analysis technique presenting system includes a storage apparatus, an identifying unit, a replacing unit, and a presenting unit. The storage apparatus stores a plurality of analysis modules that are in which each of a plurality of types of analysis processing is divided into a plurality of steps, a plurality of analysis techniques that combine, for each model of the mechanism, some of the plurality of analysis modules to perform predetermined analysis processing, analysis module information that associates the analysis module with the corresponding model of the mechanism, and analysis technique information that associates, for each of the analysis techniques, a list of the analysis modules belonging to the corresponding analysis technique with the model. The identifying unit identifies, when the analysis technique associated with a model input to the analysis technique presenting system is not present in the analysis technique information, the analysis module matching the input model from the analysis module information. The replacing unit replaces, from among the list of the analysis modules belonging to the analysis technique, the analysis module, which is associated with the model different from the input model, with the identified analysis module. The presenting unit presents the analysis technique including the analysis module replaced by the replacing unit.

In this example aspect, modules of a plurality of steps are created from the analysis processing to be performed on the data obtained from the mechanism, and the analysis modules are flexibly combined according to the analysis purpose and the model of the mechanism to create the analysis package (the analysis technique). In particular, when a desired analysis technique has not been registered in advance, an analysis module that matches the model can be identified from the existing analysis modules and the module in the list of modules of the existing analysis technique is replaced to thereby add and generate an appropriate analysis technique. This enables an appropriate analysis technique to be presented in response to an analysis request.

The analysis technique presenting system further includes: a first information processing apparatus connected to the facility and the storage apparatus; and a second information processing apparatus connected to the first information processing apparatus and the storage apparatus via a network. The first information processing apparatus may perform the predetermined analysis processing to apply any one of the plurality of analysis techniques to data obtained from the mechanism. The identifying unit and the replacing unit may be provided in the second information processing apparatus. Thus, when the analysis technique associated with the input model is present in the analysis technique information, the first information processing apparatus can perform the analysis processing without accessing the second information processing apparatus via the network. This enables the analysis processing to be started faster.

The analysis technique presenting system desirably further includes an adding unit configured to, when applicable information, which has been received from a user in response to a result of applying the analysis technique presented for the data obtained from the mechanism, indicates appropriate, associate the presented analysis technique, the list of the analysis modules including the replaced analysis module, and the input model, and then add the association to the storage apparatus as the analysis technique information. Consequently, the analysis techniques with user-proven records, from among the analysis techniques presented as new combinations of the analysis modules, can be accumulated. This improves the probability of searching an appropriate analysis technique in response to an analysis request.

The analysis technique presenting system further includes a history registering unit configured to, when the applicable information, which has been received from the user in response to the result of applying a first analysis technique to first data obtained from a first mechanism, indicates appropriate, associate the first data with the first analysis technique and register the association in the storage apparatus as history information. After the registration, when the applicable information, which has been received from the user in response to the result of applying a second analysis technique to second data obtained from a second mechanism, indicates inappropriate, the identifying unit may refer to the history information to identify the analysis technique associated with data that outputs data in a manner similar to the second data and identify a module related to waveform analysis of the data that outputs data in the manner similar to the second data among the analysis modules belonging to the identified analysis technique. As described above, the analysis techniques proved by the user as being the appropriate analysis results and the data obtained at this time as the history information are stored. This enables, when the analysis result of the future analysis processing is not appropriate, the analysis module with an appropriate analysis result on the similar waveform data to be identified from among the past records. In this way, the analysis technique that may produce reasonable results can be presented.

When the identifying unit cannot identify the analysis module matching the input model, the replacing unit replaces, from among the list of the analysis modules belonging to the analysis technique, the analysis module, which is associated with the model different from the input model, with a new analysis module input from outside. This allows new analysis module to be easily added to be used for the analysis package.

A second example aspect of the present disclosure is an analysis technique presenting method for presenting an analysis technique according to a mechanism included in a facility. In an information processing apparatus including a storage apparatus that stores a plurality of analysis modules that are in which each of a plurality of types of analysis processing is divided into a plurality of steps, a plurality of analysis techniques that combine, for each model of the mechanism, some of the plurality of analysis modules to perform predetermined analysis processing, analysis module information that associates the analysis module with the corresponding model of the mechanism, and analysis technique information that associates, for each of the analysis techniques, a list of the analysis modules belonging to the corresponding analysis technique with the model, the analysis technique presenting method includes: identifying, when the analysis technique associated with a model input to the information processing apparatus is not present in the analysis technique information, the analysis module matching the input model from the analysis module information; replacing, from among the list of the analysis modules belonging to the analysis technique, the analysis module, which is associated with the model different from the input model, with the identified analysis module; and presenting the analysis technique including the replaced analysis module.

A third example aspect of the present disclosure is a non-transitory computer readable medium storing an analysis technique presenting program for presenting an analysis technique according to a mechanism included in a facility. The analysis technique presenting program causes a computer including a storage apparatus that stores a plurality of analysis modules that are in which each of a plurality of types of analysis processing is divided into a plurality of steps, a plurality of analysis techniques that combine, for each model of the mechanism, some of the plurality of analysis modules to perform predetermined analysis processing, analysis module information that associates the analysis module with the corresponding model of the mechanism, and analysis technique information that associates, for each of the analysis techniques, a list of the analysis modules belonging to the corresponding analysis technique with the model, to execute: identifying, when the analysis technique associated with a model input to the information processing apparatus is not present in the analysis technique information, the analysis module matching the input model from the analysis module information; replacing, from among the list of the analysis modules belonging to the analysis technique, the analysis module, which is associated with the model different from the input model, with the identified analysis module; and presenting the analysis technique including the replaced analysis module. The second and third example aspect can expectantly achieve effects similar to those of the first example aspect.

According to the present disclosure, it is possible to provide an analysis technique presenting system, a method, and a program for presenting an appropriate analysis technique in response to an analysis request.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Hereinafter, specific embodiments to which the present disclosure including the above-described example aspects is applied will be described in detail with reference to the drawings. In the drawings, the same elements are denoted by the same reference signs, and repeated descriptions are omitted for clarity of the description.

First Embodiment of the Present Disclosure

Figure 1:
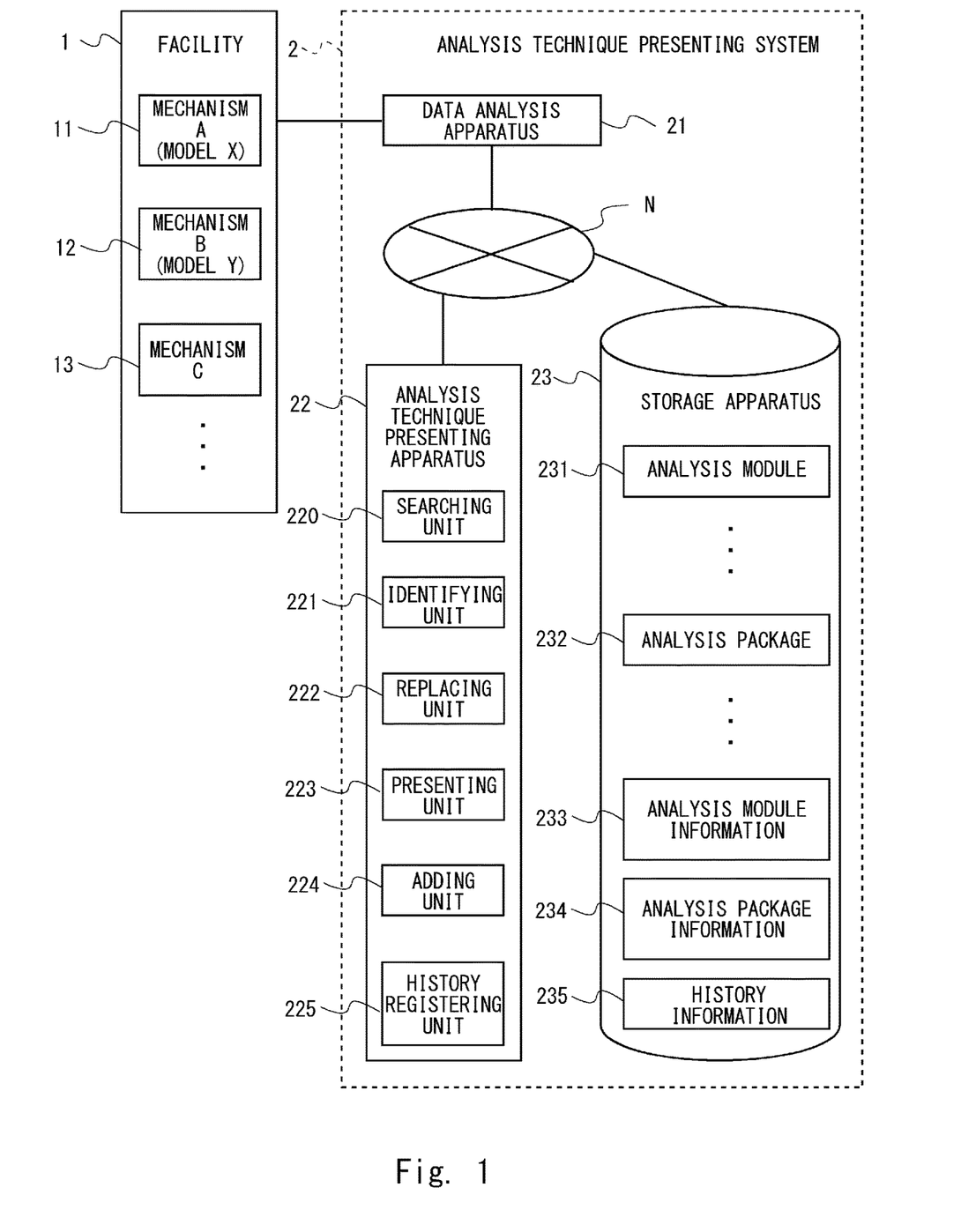
FIG. 1 is a block diagram showing an overall configuration including an analysis technique presenting system according to a first embodiment of the present disclosure.

FIG. 1 is a block diagram showing an overall configuration including an analysis technique presenting system 2 according to a first embodiment of the present disclosure. An analysis technique presenting system 2 is an information system that presents an analysis technique according to a mechanism A11, a mechanism B12, a mechanism C13 . . . etc. that are included in a facility 1. The "mechanism" here is, for example, a motor, a bearing, or the like of a specific part. For example, the mechanism A11 is of a model X, which is one of a plurality of models for the same kind of mechanism. The mechanism B12 is of a model Y, which is one of a plurality of models for the mechanism that is the same as or different from the mechanism A11. The mechanisms included in the facility 1 may include a mechanism that does not conform to a predetermined model, like the mechanism C13. In the following descriptions, "analysis technique" and "analysis package" are used synonymously.

The analysis technique presenting system 2 includes a data analysis apparatus 21, an analysis technique presenting apparatus 22, and a storage apparatus 23. The data analysis apparatus 21 is connected to the facility 1 and is also connected to the analysis technique presenting apparatus 22 and the storage apparatus 23 via a network N. Note that the data analysis apparatus 21 may be connected to the analysis technique presenting apparatus 22 and the storage apparatus 23 without the network N. The data analysis apparatus 21 is an information processing apparatus that applies one of a plurality of analysis techniques and performs predetermined analysis processing on data obtained from the mechanism A11 or the like. The data obtained from the mechanism A11 or the like is, for example, time-series data including a detection value obtained by, for example, a sensor (not shown). The data analysis apparatus 21 holds the data obtained from each mechanism in an internal or external storage apparatus (not shown). Note that the data analysis apparatus 21 may be, for example, an edge analysis terminal capable of executing data analysis software.

The storage apparatus 23 is a non-volatile storage apparatus. The storage apparatus 23 stores a plurality of analysis modules 231, a plurality of analysis packages 232, analysis module information 233, analysis package information 234, and history information 235. Each of the plurality of analysis modules 231 is a program module indicating one of divided steps of one of a plurality of types of the analysis processing. The step is, for example, an input step, an analysis step, a determination step, an output step, or the like. Each of the analysis modules 231 is created for one of the steps. The analysis modules 231 have a standardized input and output interface. Any of the analysis modules 231 is implemented so that it will become pre-processing or post-processing of other analysis modules.

The plurality of analysis packages 232 are an example of the analysis technique that combines some of the analysis modules 231 and performs predetermined analysis processing for each model of the mechanism. That is, the analysis package 232 is a combination of some of the analysis modules 231 and defines an execution order of the analysis modules.

Figure 2:
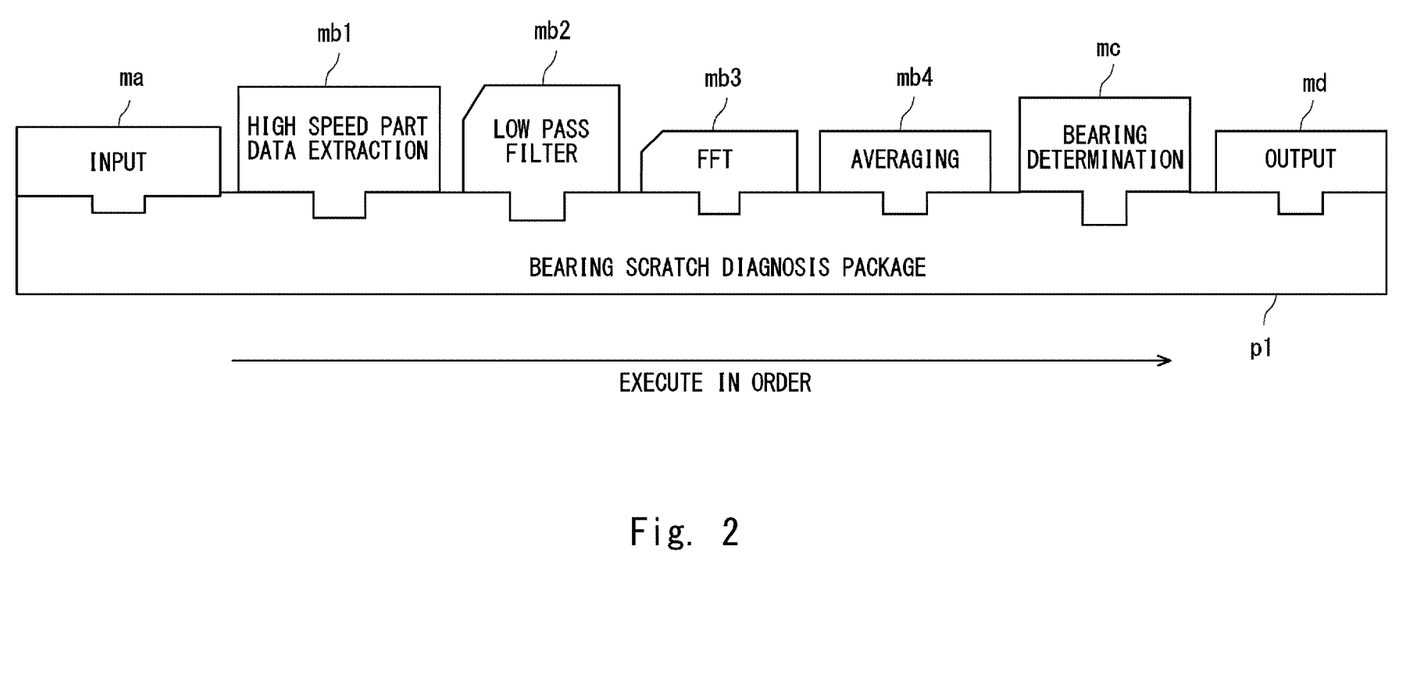
FIG. 2 is a diagram for describing a concept of an analysis package and analysis modules according to the first embodiment of the present disclosure.

FIG. 2 is a diagram for describing the concept of the analysis package and the analysis modules according to the first embodiment of the present disclosure. FIG. 2 shows a bearing scratch diagnosis package p1 as an example of the analysis package 232. An input module ma, a high speed part data extraction module mb1, a low pass filter module mb2, an FFT (Fast Fourier Transform) module mb3, an averaging module mb4, a bearing determination module mc, and an output module md belong to the bearing scratch diagnosis package p1. When the data analysis apparatus 21 executes the bearing scratch diagnosis package p1, it performs processing of each module in the direction from the left to the right in FIG. 2. Here, the input module ma is the input step. The high speed part data extraction module mb1, the low pass filter module mb2, the FFT module mb3, and the averaging module mb4 are the analysis steps. The bearing determination module mc is the determination step. The output module md is the output step. In the analysis step, an absolute value calculation module may be included between the high speed part data extraction module mb1 and the low pass filter module mb2. The bearing determination module mc corresponds to a predetermined model. Thus, when the model of the mechanism to be analyzed is different from the bearing determination module mc, there is another bearing determination module mc that matches the model of the mechanism to be analyzed. That is, there are a plurality of bearing determination modules mc corresponding to the respective plurality of models. The bearing scratch diagnosis package p1 itself also depends on the model corresponding to the bearing determination module mc. Although the low pass filter module mb2 is a model-independent analysis module, the low pass filter module mb2 may employ various filter methods. Thus, there are a plurality of general-purpose low pass filter modules mb2 that can be applied to various mechanisms and models.

Figure 3:
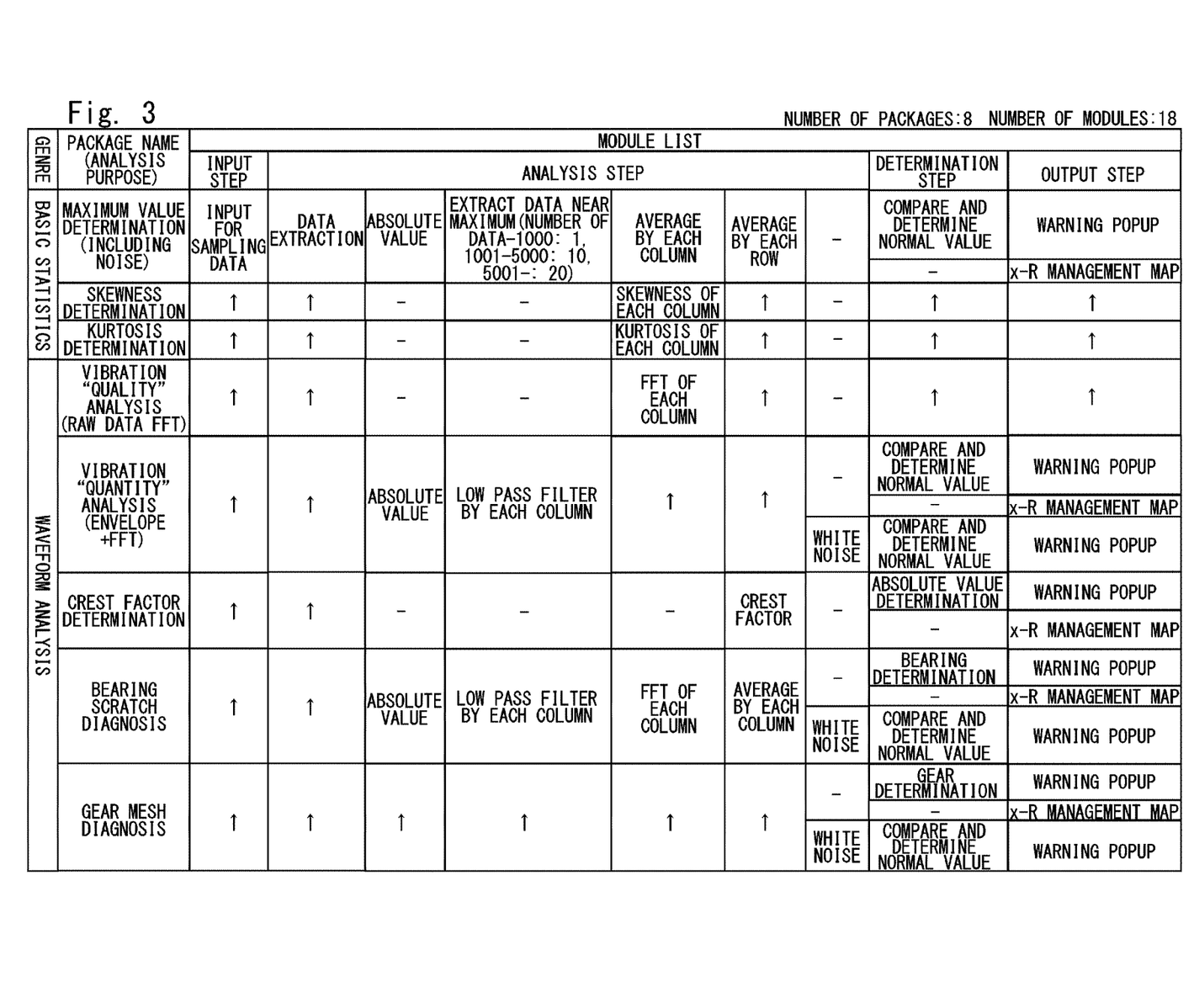
FIG. 3 is a diagram showing an example of the analysis packages and the analysis modules according to the first embodiment of the present disclosure.

FIG. 3 is a diagram showing an example of the analysis packages and the analysis modules according to the first embodiment of the present disclosure. Note that "-" in FIG. 3 means that there is no applicable analysis module. Each of the up arrows in FIG. 3 means that the module in the corresponding cell is the same as the analysis module written in the above cell. As an example, eight analysis packages and 18 analysis modules are shown, but they are not limited to these numbers. In particular, there are a plurality of "bearing determination" modules, which are determination steps, of the "bearing scratch diagnosis" package for the respective models. Accordingly, there are a plurality of "bearing scratch diagnosis" packages that differ only in the "bearing determination" modules corresponding to the respective models. That is, there can be a plurality of types of packages according to the model even for the same analysis purpose. However, packages for all models and packages including combinations of all modules are not registered in advance.

Referring back to FIG. 1, the description will be continued. The analysis module information 233 of the storage apparatus 23 is management information that associates each of the analysis modules with the model of the mechanism corresponding to the analysis module. The analysis module information 233 includes, for example, an analysis module ID, the model of the corresponding mechanism, the step, and an overview description of the analysis processing. The analysis module information 233 may further include the kind of algorithm of the analysis processing and the like. The model is not indispensable for the analysis module information 233. That is, a model-independent analysis module may be included.

The analysis package information 234 is management information that associates, for each analysis package, a list of the analysis modules belonging to the analysis package with the model. The analysis package information 234 includes, for example, an analysis package ID, an analysis purpose, the model of the corresponding mechanism, and a list of modules belonging to the analysis package. The list of modules belonging to the analysis package defines the combinations of IDs of the analysis modules belonging to the analysis package and also a processing order.

The history information 235 associates the original data (obtained data) to be analyzed with the analysis package applied to the analysis processing of the obtained data. Note that only the representative value may be used as the original data to be analyzed. The obtained data here is waveform data collected during a predetermined sampling period. In addition to these items, the history information 235 may include data before and after processing the corresponding analysis module. For example, data before and after low pass filtering may be included. In addition to these items, the history information 235 may include a final result of the analysis processing. The history information 235 may further include a judgement result of a user whether he/she judges the final result of the analysis processing is appropriate. For example, when the user detects a sign of an abnormality in the mechanism from the analysis result, he/she judges that this analysis result is appropriate. In other words, the user judges that the analysis package is appropriate for the desired analysis purpose with respect to the model of the mechanism to be analyzed. Alternatively, even when the user detects no sign of an abnormality in the mechanism from the analysis result, he/she judges that the analysis result is appropriate. On the other hand, when the user cannot make a judgement by a sign of an abnormality in the mechanism from the analysis result, he/she judges that the analysis result is inappropriate.

The analysis technique presenting apparatus 22 is an information processing apparatus including a searching unit 220, an identifying unit 221, a replacing unit 222, a presenting unit 223, an adding unit 224, and a history registering unit 225. The searching unit 220 receives an input of the analysis purpose and the model of mechanism to be analyzed from the user and searches the analysis package information 234 for the analysis package corresponding to the input analysis purpose and model. When the analysis package associated with the model input to the searching unit 220 is not present in the analysis package information 234, the identifying unit 221 extracts, from the analysis module information 233, the analysis module matching the input model. The replacing unit 222 replaces, from among the list of the analysis modules belonging to the analysis package, the analysis module associated with the model different from the model input to the searching unit 220 with the analysis module identified by the identifying unit 221. The presenting unit 223 presents the analysis package including the analysis module replaced by the replacing unit 222 to the user. For example, the presenting unit 223 displays information of the analysis package to be presented on a display apparatus (not shown) of the analysis technique presenting apparatus 22.

The analysis technique presenting apparatus 22 receives, from the user, an instruction for the analysis processing by the analysis package presented by the presenting unit 223 and instructs the data analysis apparatus 21 to execute predetermined analysis processing to which the analysis package is applied. Then, the analysis technique presenting apparatus 22 presents the analysis result to the user. For example, the analysis technique presenting apparatus 22 displays the analysis result on the display apparatus. The analysis technique presenting apparatus 22 then receives, from the user, applicable information according to the analysis result. When the applicable information received from the user indicates appropriate, the adding unit 224 of the analysis technique presenting apparatus 22 associates the analysis package presented by the presenting unit 223, the list of modules belonging to the analysis package including the replaced analysis modules, and the model input to the searching unit 220 and adds the association to the storage apparatus 23 as the analysis package information 234. Consequently, the analysis techniques with user-proven records, from among the analysis techniques presented as new combinations of the analysis modules, can be accumulated. This improves the probability of searching an appropriate analysis technique in response to future analysis requests.

When the applicable information received from the user indicates appropriate, the history registering unit 225 associates first obtained data (obtained from a first mechanism) with a first analysis package (applied to the analysis of the first obtained data) and registers the association in the storage apparatus 23 as the history information 235. After the registration of the history information 235, when the applicable information indicates inappropriate, where the applicable information is information about when a second analysis package is applied to second obtained data obtained from a second mechanism, the identifying unit 221 refers to the history information 235 to identify an analysis package associated with obtained data that outputs data (e.g., waveform data) in a manner similar to the second obtained data. Then, the identifying unit 221 identifies the module related to waveform analysis of the similar obtained data among the analysis modules belonging to the identified analysis package. The module related to the waveform analysis is, for example, a low pass filter module. That is, even when an appropriate result cannot be obtained by the analysis package matching the initially input analysis purpose and model, the low pass filter module that has a record of a favorable result in the past regarding another analysis purpose and another model can be identified according to the similarity of the waveform data of the mechanism to be analyzed. For the determination of the similarity in the waveform data, existing methods such as pattern matching may be used.

In other words, the analysis techniques proved by the user to be the appropriate analysis results and the data obtained at this time as the history information are stored. This enables, when the analysis result of the future analysis processing is not appropriate, the analysis module with an appropriate analysis result on the similar waveform data to be identified from among the past records. In this way, the analysis technique that may produce reasonable results can be presented.

When the identifying unit 221 cannot identify the analysis module matching the model input to the searching unit 220, the replacing unit 222 replaces, from among the list of the analysis modules belonging to the analysis package, the analysis module associated with the model different from the model input to the searching unit 220 with new analysis module input from the outside. This allows new analysis module to be easily added to be used for the analysis package.

Figure 4:
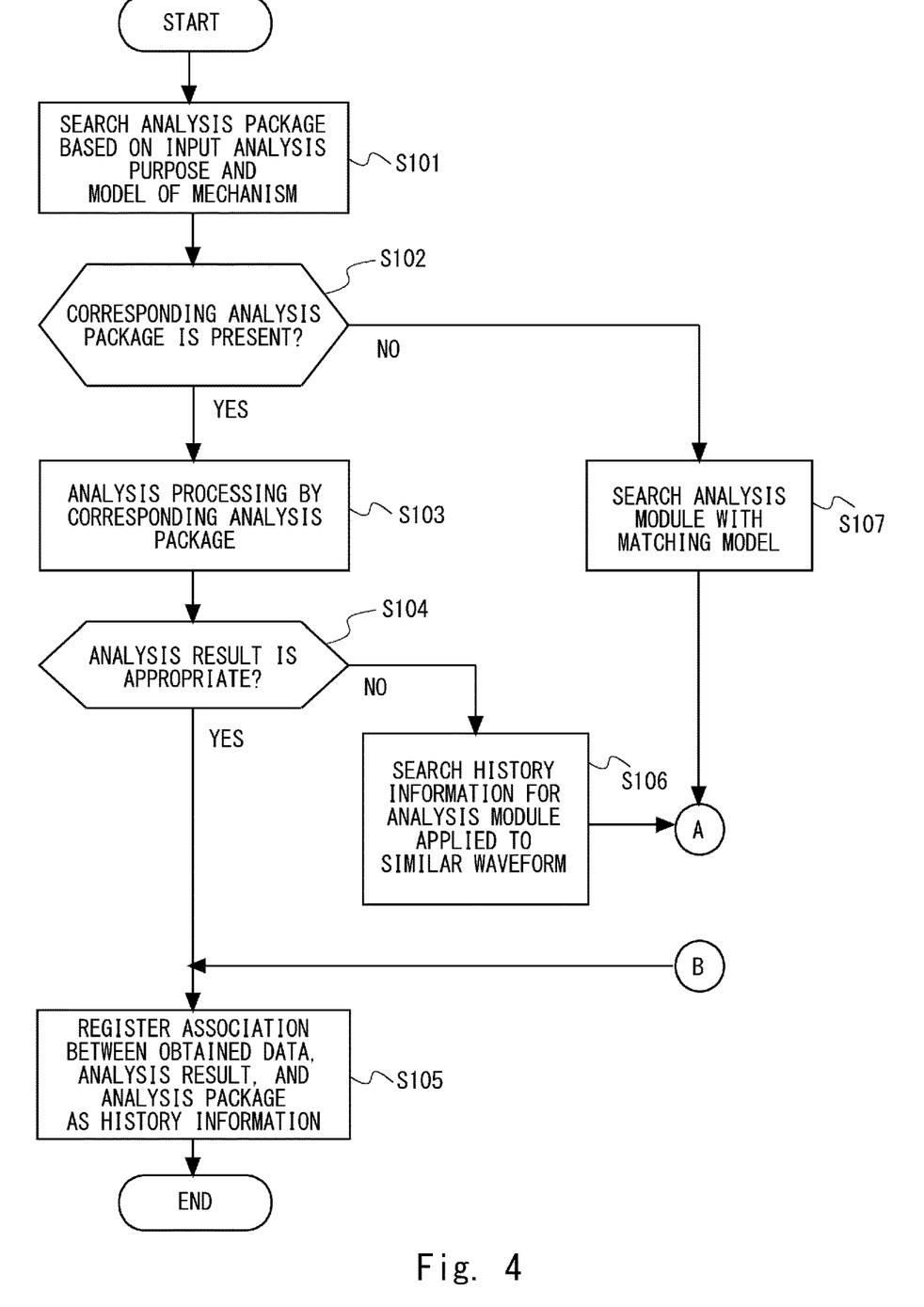
FIG. 4 is a flowchart showing a flow of analysis technique presenting processing according to the first embodiment of the present disclosure.
Figure 5:
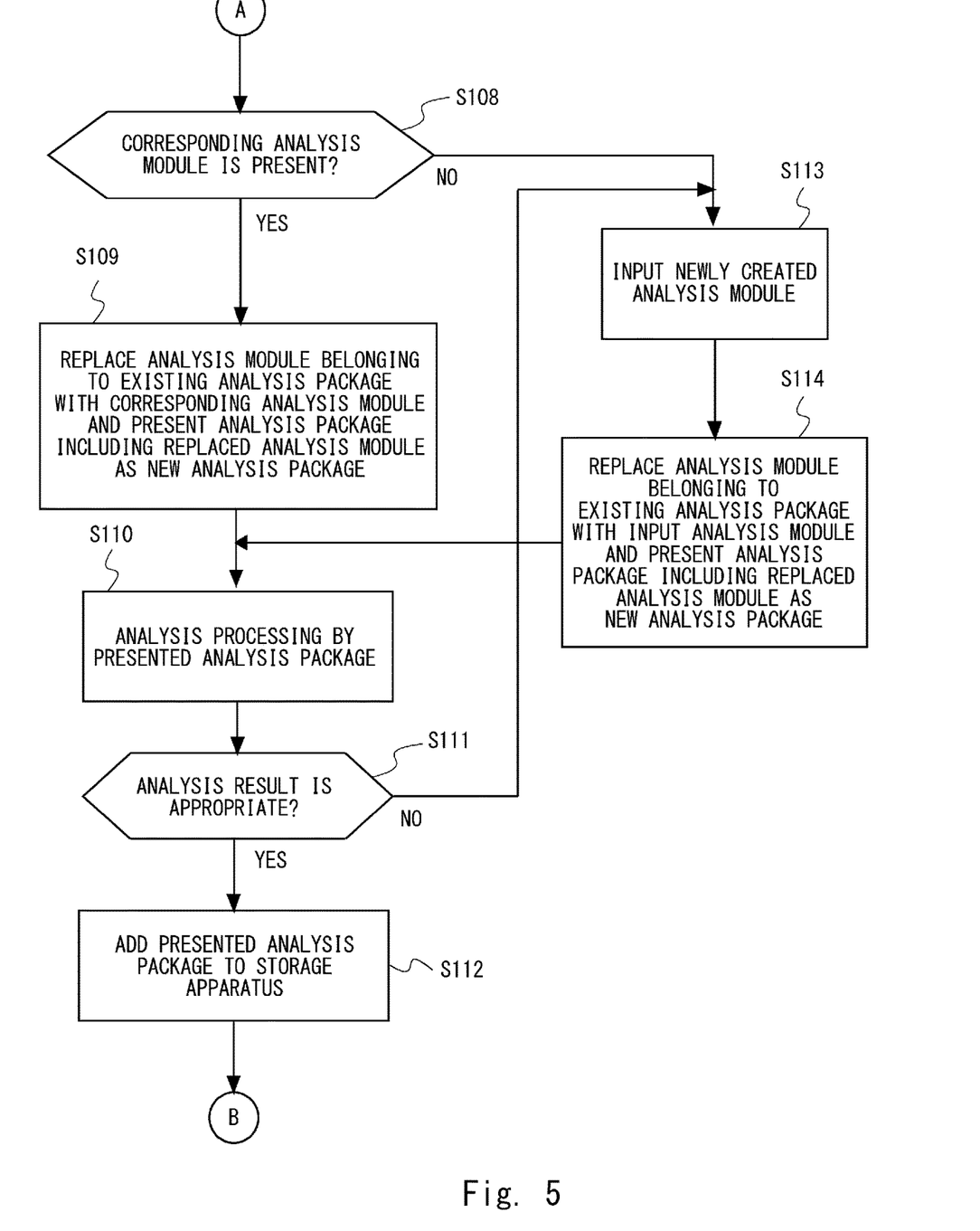
FIG. 5 is a flowchart showing a flow of the analysis technique presenting processing according to the first embodiment of the present disclosure.

FIGS. 4 and 5 are flowcharts showing a flow of the analysis technique presenting processing according to the first embodiment of the present disclosure. First, the searching unit 220 receives, from the user, an input of the analysis purpose and the model of the mechanism to be analyzed. Next, the searching unit 220 searches the analysis package information 234 for the analysis package based on the input analysis purpose and model of the mechanism (S101). Next, the searching unit 220 determines whether the corresponding analysis package is present (S102). When the corresponding analysis package is present, the presenting unit 223 displays the corresponding analysis package on the display apparatus. Next, the analysis technique presenting apparatus 22 receives, from the user, the instruction for the analysis processing by the analysis package presented by the presenting unit 223 and instructs the data analysis apparatus 21 to execute the analysis processing specifying the mechanism to be analyzed and the corresponding analysis package. Then, in response to the instruction from the analysis technique presenting apparatus 22, the data analysis apparatus 21 executes the analysis processing by the analysis package specified by the analysis technique presenting apparatus 22 on the data obtained from the mechanism to be analyzed (S103), and outputs the analysis result to the analysis technique presenting apparatus 22.

The analysis technique presenting apparatus 22 displays the analysis result from the data analysis apparatus 21 on the display apparatus, and receives the input of the applicable information about the analysis result from the user. The analysis technique presenting apparatus 22 determines whether the applicable information received from the user indicates appropriate (S104). When the applicable information indicates appropriate, that is, when the analysis result is appropriate, the history registering unit 225 registers the association between the obtained data to be analyzed, the analysis result, and the applied analysis package in the storage apparatus 23 as the history information 235 (S105).

On the other hand, when the applicable information indicates inappropriate in Step S104, that is, when the analysis result is inappropriate, the identifying unit 221 searches the history information 235 for the analysis module applied to the waveform similar to the obtained data to be analyzed (S106). That is, firstly, the identifying unit 221 searches the history information 235 for the waveform data similar to the waveform of the obtained data to be analyzed this time (e.g., the second obtained data). Then, the identifying unit 221 identifies the analysis package associated with the corresponding waveform data (e.g., the first obtained data). Next, the identifying unit 221 refers to the analysis module information 233 and the analysis package information 234 to identify the module related to the waveform analysis from the list of modules belonging to the identified analysis package. After that, the process proceeds to Step S108, which will be described later.

When the corresponding analysis package is not present in Step S102, the identifying unit 221 searches the analysis module information 233 for the analysis module matching the model input to the searching unit 220 (S107).

After Step S106 or S107, the analysis technique presenting apparatus 22 determines whether the corresponding analysis module is present (S108). When the corresponding analysis module is present, the replacing unit 222 replaces the analysis module belonging to the existing analysis package with the corresponding analysis module. Next, the presenting unit 223 presents the replaced analysis package as a new analysis package (S109). For example, the identifying unit 221 first refers to the analysis package information 234 to identify the analysis package with the same analysis purpose as the analysis purpose input to the searching unit 220 and with a model different from the model input to the searching unit 220. Next, the identifying unit 221 refers to the analysis module information 233 and the analysis package information 234 to identify the analysis module different from the model input to the searching unit 220 from the list of modules belonging to the identified analysis package. Next, the replacing unit 222 replaces the analysis module for the different model with the analysis module matching the input model (the analysis module identified in Step S107). For example, the replacing unit 222 updates the module IDs of the list of modules belonging to the analysis package identified by the identifying unit 221. Next, the presenting unit 223 displays the new analysis package including the updated list of modules belonging to the analysis package on the display apparatus.

In Step S108, when no corresponding analysis module is present, the analysis technique presenting apparatus 22 displays that fact on the display apparatus. This allows the user to create a new analysis module. Next, the analysis technique presenting apparatus 22 receives an input of the newly created analysis module from the user (S113). Next, the replacing unit 222 replaces some modules belonging to the existing analysis package with the input analysis modules. Next, the presenting unit 223 presents the replaced analysis package as the new analysis package (S114). Note that as the specific processing in Step S114 is the same as that in Step S109, the description thereof will be omitted.

After Step S109 or S114, the analysis technique presenting apparatus 22 receives, from the user, the instruction for the analysis processing by the analysis package presented by the presenting unit 223 and instructs the data analysis apparatus 21 to execute the analysis processing specifying the mechanism to be analyzed and the corresponding analysis package. Then, in response to the instruction from the analysis technique presenting apparatus 22, the data analysis apparatus 21 executes the analysis processing by the analysis package specified by the analysis technique presenting apparatus 22 on the data obtained from the mechanism to be analyzed (S110), and outputs the analysis result to the analysis technique presenting apparatus 22.

The analysis technique presenting apparatus 22 displays the analysis result from the data analysis apparatus 21 on the display apparatus, and receives the input of the applicable information about the analysis result from the user. The analysis technique presenting apparatus 22 determines whether the applicable information received from the user indicates appropriate (S111). When the applicable information indicates appropriate, that is, when the analysis result is appropriate, the adding unit 224 adds the analysis package presented by the presenting unit 223 to the storage apparatus 23 (S112). After that, the process proceeds to Step S105.

On the other hand, when the applicable information indicates inappropriate in Step S111, that is, when the analysis result is inappropriate, the process proceeds to Step S113 to repeat the processing. An example of the analysis technique presenting processing according to the first embodiment of the present disclosure has been described so far.

As described above, there are wide ranges of analysis requests for mechanisms of various types and models. Thus, preparing the analysis packages in advance has some limitations. To solve this problem, in the present disclosure, modules of a plurality of steps are created from the analysis processing to be performed on the data obtained from the mechanism, and the analysis modules are flexibly combined according to the analysis purpose and the model of the mechanism to create the analysis package (the analysis technique). In particular, when a desired analysis technique has not been registered in advance, an analysis module that matches the model can be identified from the existing analysis modules and the module in the list of modules of the existing analysis technique is replaced to thereby add and generate an appropriate analysis technique. This enables an appropriate analysis technique to be presented in response to an analysis request.

In other words, the present disclosure enhances the versatility of the analysis modules (i.e., standardizing and defining the input and output IF) to flexibly combine the analysis modules and to prepare for future analysis requests. This makes it easy to present an unknown combination of the analysis modules in response to an analysis request. In this manner, those who are unfamiliar with the analysis of the data obtained from the mechanism can apply an appropriate analysis package.

The analysis technique presenting system 2 according to the embodiment of the present disclosure may be modified as follows. For example, the analysis modules 231, the analysis packages 232, the analysis module information 233, and the analysis package information 234 are stored in a storage apparatus in the data analysis apparatus 21 (a first information processing apparatus). The data analysis apparatus 21 includes the searching unit 220 and the presenting unit 223, and provides a search interface for the user. On the other hand, the analysis technique presenting apparatus 22 (a second information processing apparatus) includes the identifying unit 221 and the replacing unit 222. In this case, the data analysis apparatus 21 receives the model and the analysis purpose from the user, and the searching unit 220 performs a search in the internal storage apparatus. When the analysis package associated with the model input by the user is present in the analysis package information, the first information processing apparatus can continue the analysis processing. That is, in this case, there is no need to access the second information processing apparatus via the network N. This achieves an effect that the analysis processing can be started faster. Further, as simple search processing is carried out by the first information processing apparatus, and identification of corresponding analysis modules and replace processing are carried out by the second information processing apparatus, load can be distributed.

The present disclosure is not limited to the above-described embodiments and can be appropriately changed without departing from the scope of the present disclosure. For example, in the above embodiments, the present disclosure has been described as a hardware configuration, but the present disclosure is not limited to this. In the present disclosure, any processing can be achieved, for example, by causing a CPU (Central Processing Unit) to execute a computer program.

In the above example, the program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g., magneto-optical disks), CD-ROM (Read Only Memory), CD-R, CD-R/W, DVD (Digital Versatile Disc), and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

From the present disclosure thus described, it will be obvious that the embodiments of the present disclosure may be varied in many ways. Such variations are not to be regarded as a departure from the spirit and scope of the present disclosure, and all such modifications as would be obvious to one skilled in the art are intended for inclusion within the scope of the following claims.

What is claimed is:

1. An analysis technique presenting system for presenting a bearing scratch diagnosis technique for a bearing of a mechanism included in a facility, the analysis technique presenting system comprising:
   a storage apparatus including memory storing:
      a plurality of analysis modules . . . the plurality of analysis modules being executed upon performing the bearing scratch diagnosis technique on the bearing of the mechanism
      a plurality of analysis techniques of bearing scratch diagnosis that combine, for each model of the mechanism, a sub-set of the plurality of analysis modules to perform a predetermined analysis processing of the bearing scratch diagnosis,
      analysis module information that associates each of the plurality of analysis modules with a corresponding model of the mechanism, and
      analysis technique information that associates, for each of the plurality of analysis techniques, the sub-set of the plurality of analysis modules combined by a corresponding analysis technique of the plurality of analysis techniques with the corresponding model; and
   an analysis technique presenting apparatus in communication with the storage apparatus, the analysis technique presenting apparatus including one or more processors configured to function as:
      an identifying unit configured to identify an analysis module of the plurality of analysis modules matching a model input to the analysis technique presenting system from the analysis module information, when an analysis technique of the bearing scratch diagnosis associated with the inputted model is not present in the analysis technique information,
      a replacing unit configured to replace, from among the sub-set of the plurality of analysis modules combined by the corresponding analysis technique of the plurality of analysis techniques, an analysis module that is associated with a model different from the inputted model with the identified analysis module, and
      a presenting unit configured to perform processes to:
         (i) present the analysis technique of the bearing scratch diagnosis including the identified analysis module replaced by the replacing unit,
         (ii) receive an input selecting the presented analysis technique,
         (iii) instruct a data analysis apparatus to execute the selected analysis technique of the bearing scratch diagnosis on the mechanism, the data analysis apparatus detecting bearing scratch data related to the bearing of the mechanism using a sensor, and
         (iv) present a result of the execution of the selected analysis technique of the bearing scratch diagnosis on the mechanism, wherein:
      in response to receiving an indication that indicates that the result is incorrect, the identifying unit applies a low pass filter to a waveform of the detected bearing scratch data, searches a stored history information of previously obtained waveform data to determine similar waveform data that is similar to the filtered waveform of the detected bearing scratch data, and identifies a different analysis module of the plurality of analysis modules that corresponds to the determined similar waveform data, and
      in response to identifying the different analysis module of the plurality of analysis modules, the replacing unit replaces the analysis module corresponding to the incorrect results with the identified different analysis module, and the presenting unit re-performs processes (i)-(iv) using the different analysis module.

2. The analysis technique presenting system according to claim 1, wherein:
   the analysis technique presenting apparatus includes:
      a first information processing apparatus connected to the facility and the storage apparatus; and
      a second information processing apparatus connected to the first information processing apparatus and the storage apparatus via a network,
   the first information processing apparatus performs the predetermined analysis processing to apply any one of the plurality of analysis techniques to data obtained from the mechanism, and
   the identifying unit and the replacing unit are provided in the second information processing apparatus.

3. The analysis technique presenting system according to claim 1, wherein the one or more processors of the analysis technique presenting apparatus are configured to function as an adding unit, wherein the adding unit is configured to associate the presented analysis technique and the inputted model, and to store the association of the presented analysis technique and the inputted model to the storage apparatus as the analysis technique information, when applicable information, which was received from a user in response to a result of applying the presented analysis technique with data obtained from the mechanism, indicates the presented analysis technique as appropriate analysis technique.

4. The analysis technique presenting system according to claim 1, wherein:
the one or more processors of the analysis technique presenting apparatus are configured to function as a history registering unit, wherein the history registering unit is configured to associate first data with a first analysis technique and register the association in the storage apparatus as the stored history information, when applicable information, which was received from a user in response to a result of applying the first analysis technique to the first data obtained from the mechanism, indicates the first analysis technique as appropriate analysis technique, and
after the registration, the identifying unit refers to the stored history information to identify an analysis technique associated with data similar to second data, and to identify an analysis module of the plurality of analysis modules related to a waveform analysis of the data similar to the second data among the plurality of analysis modules combined by the identified analysis technique, when second applicable information, which was received from the user in response to a result of applying a second analysis technique to the second data obtained from a second mechanism, indicates the second analysis technique as inappropriate analysis technique.

5. The analysis technique presenting system according to claim 1, wherein when the identifying unit cannot identify the analysis module matching the inputted model, the replacing unit replaces, from among the sub-set of the analysis modules combined by the analysis technique, the analysis module that is associated with a model different from the inputted model with a new inputted analysis module of the plurality of analysis modules.

6. An analysis technique presenting method for presenting a bearing scratch diagnosis technique for a bearing of a mechanism included in a facility, an information processing apparatus including a storage apparatus that stores (i) a plurality of analysis modules . . . the plurality of analysis modules being executed upon performing the bearing scratch diagnosis technique on the bearing of the mechanism, (ii) a plurality of analysis techniques of bearing scratch diagnosis that combine, for each model of the mechanism, a sub-set of the plurality of analysis modules to perform a predetermined analysis processing of the bearing scratch diagnosis, (iii) analysis module information that associates each of the plurality of analysis modules with a corresponding model of the mechanism, and (iv) analysis technique information that associates, for each of the plurality of analysis techniques, the sub-set of the plurality of analysis modules combined by a corresponding analysis technique of the plurality of analysis techniques with the corresponding model, the analysis technique presenting method comprising:
identifying, by one or more processors, an analysis module of the plurality of analysis modules matching a model input to an analysis technique presenting system from the analysis module information, when an analysis technique of the bearing scratch diagnosis associated with the inputted model is not present in the analysis technique information;
replacing, by the one or more processors, from among the sub-set of the plurality of analysis modules combined by the corresponding analysis technique of the plurality of analysis techniques, an analysis module that is associated with a model different from the inputted model with the identified analysis module;
presenting, as a process (i), by the one or more processors, the analysis technique of the bearing scratch diagnosis including the identified analysis module;
receiving, as a process (ii), an input selecting the presented analysis technique;
instructing, as a process (iii), a data analysis apparatus to execute the selected analysis technique of the bearing scratch diagnosis on the mechanism, the data analysis apparatus detecting bearing scratch data related to the bearing of the mechanism using sensor;
presenting, as a process (iv), a result of the execution of the selected analysis technique of the bearing scratch diagnosis on the mechanism;
in response to receiving an indication that indicates that the result is incorrect, applying a low pass filter to a waveform of the detected bearing scratch data, searching a stored history information of previously obtained waveform data to determine similar waveform data that is similar to the filtered waveform of the detected bearing scratch data, and identifying a different analysis module of the plurality of analysis modules that corresponds to the determined similar waveform data; and
in response to identifying the different analysis module of the plurality of analysis modules, replacing the analysis module corresponding to the incorrect result with the identified different analysis module, and re-performing the processes (i)-(iv) using the different analysis module.

7. A non-transitory computer readable storage medium storing an analysis technique presenting program for presenting a bearing scratch diagnosis technique for a bearing of a mechanism included in a facility, the analysis technique presenting program causing a computer including a storage apparatus that stores (i) a plurality of analysis modules . . . the plurality of analysis modules being executed upon performing the bearing scratch diagnosis technique on the bearing of the mechanism, (ii) a plurality of analysis techniques that combine, for each model of the mechanism, a sub-set of the plurality of analysis modules to perform a predetermined analysis processing of the bearing scratch diagnosis, (iii) analysis module information that associates each of the plurality of analysis modules with a corresponding model of the mechanism, and (iv) analysis technique information that associates, for each of the plurality of analysis techniques, the sub-set of the plurality of analysis modules combined by a corresponding analysis technique of the plurality of analysis techniques with the corresponding model, the analysis technique presenting program causing the computer to execute:
identifying an analysis module of the plurality of analysis modules matching a model input to an analysis technique presenting system from the analysis module information, when an analysis technique of the bearing scratch diagnosis associated with the inputted model is not present in the analysis technique information;
replacing, from among the sub-set of the plurality of analysis modules combined by the corresponding analysis technique of the plurality of analysis techniques, an analysis module that is associated with a model different from the inputted model with the identified analysis module;

presenting, as a process (i), by the one or more processors, the analysis technique of the bearing scratch diagnosis including the identified analysis module;

receiving, as a process (ii), an input selecting the presented analysis technique;

instructing, as a process (iii), a data analysis apparatus to execute the selected analysis technique of the bearing scratch diagnosis on the mechanism, the data analysis apparatus detecting bearing scratch data related to the bearing of the mechanism using a sensor;

presenting, as a process (iv), a result of the execution of the selected analysis technique of the bearing scratch diagnosis on the mechanism;

in response to receiving an indication that indicates that the result is incorrect, applying a low pass filter to a waveform of the detected bearing scratch data, searching a stored history information of previously obtained waveform data to determine similar waveform data that is similar to the filtered waveform of the detected bearing scratch data, and identifying a different analysis module of the plurality of analysis modules that corresponds to the determined similar waveform data; and in response to identifying the different analysis module of the plurality of analysis modules, replacing the analysis module corresponding to the incorrect result with the identified different analysis module, and re-performing the processes (i)-(iv) using the different analysis module.

* * * * *